US007644856B2

(12) United States Patent
Sakaguchi

(10) Patent No.: US 7,644,856 B2
(45) Date of Patent: Jan. 12, 2010

(54) SOLDER BALL MOUNTING METHOD AND SOLDER BALL MOUNTING APPARATUS

(75) Inventor: Hideaki Sakaguchi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 29 days.

(21) Appl. No.: 11/926,742

(22) Filed: Oct. 29, 2007

(65) Prior Publication Data

US 2008/0105734 A1 May 8, 2008

(30) Foreign Application Priority Data

Nov. 7, 2006 (JP) ............................ 2006-301991

(51) Int. Cl.
*B23K 31/02* (2006.01)

(52) U.S. Cl. ........................................ 228/246; 228/41

(58) Field of Classification Search ....................... None
See application file for complete search history.

(56) References Cited

U.S. PATENT DOCUMENTS 6,253,992 B1 * 7/2001 Fjelstad ...................... 228/245
6,268,275 B1 * 7/2001 Cobbley et al. ............. 438/612
7,105,432 B2 * 9/2006 Cobbley et al. ............. 438/612

FOREIGN PATENT DOCUMENTS

| | | | |
|---|---|---|---|
| JP | 08-236916 | | 9/1996 |
| JP | 10308412 | A * | 11/1998 |
| JP | 2002-141366 | | 5/2002 |
| JP | 2003-347343 | | 12/2003 |
| JP | 2006-5276 | | 1/2006 |
| JP | 2006-074002 | | 3/2006 |

* cited by examiner

*Primary Examiner*—Kiley Stoner
(74) *Attorney, Agent, or Firm*—Rankin, Hill & Clark LLP

(57) ABSTRACT

A solder ball mounting method includes a step of providing a flux on electrodes of a substrate, a step of arranging a plurality of solder ball mounting masks in which ball feeding openings are formed in positions opposing to the electrodes and opening areas of the ball feeding openings are set to increase toward an upper layer on the substrate, a step of mounting solder balls on the electrodes by feeding the solder balls into the ball feeding openings while moving the solder ball mounting mask as an upper layer in a surface direction of the substrate, a step of removing the solder ball mounting masks from the substrate, and a step of joining the solder balls to the electrodes.

9 Claims, 9 Drawing Sheets

43
20
40
42
41
X
41
30
9
3
12B
12A
10B
4
2
5
1
10A
53
50
54

SOLDER BALL MOUNTING METHOD AND SOLDER BALL MOUNTING APPARATUS

This application claims priority to Japanese Patent Application No. 2006-301991, filed Nov. 7, 2006, in the Japanese Patent Office. The priority application is incorporated by reference in its entirety.

TECHNICAL FIELD

The present disclosure relates to a solder ball mounting method and a solder ball mounting apparatus. More particularly, the present disclosure relates to a solder ball mounting method and a solder ball mounting apparatus for mounting fine solder balls on a substrate by using a solder ball mounting mask.

RELATED ART

In recent years, a reduction in size and thickness of the electronic equipments typified by the mobile terminal device, and the like is advancing rapidly. Also, a reduction in size and thickness is demanded of the electronic components such as the semiconductor device, etc. packaged in these electronic equipments. On the other hand, these electronic components are moving toward a higher density and thus a tendency to increase the number of connection terminals becomes conspicuous.

As the electronic component packaging method to meet these demands, the method of surface-mounting solder balls as external connection terminals on a packaging substrate such as a printed circuit, or the like by the flip chip (FC) mounting, or the like is used commonly in recent. This flip chip mounting method is such a method that the solder balls are mounted previously on electrodes provideto the substrate of the electronic components and then the solder balls are joined directly to the electrodes of the packaging substrate.

For this reason, when the surface-mounting method utilizing the solder balls is applied, the solder balls must be mounted in advance on the substrate of the electronic components. As this solder ball mounting method of mounting the solder balls on the substrate, such a method is used commonly that a flux is applied onto the electrodes of the substrate on which the solder balls are mounted, then the solder balls are placed on the flux, and then the solder balls are melted by heating and joined to the electrodes (see Patent Literature 1, for example).

FIG. 9 and FIG. 10 are views explaining concrete examples of the solder ball mounting method in the related art. FIG. 9A shows a substrate 100. In the substrate 100, a solder resist 104 is formed on an upper surface of a substrate main body 102 and an insulating film 105 is formed on a lower surface thereof. Also, a plurality of electrodes 103 are formed on an upper surface of the substrate 100, and opening portions 106 are formed in the solder resist 104 in positions that oppose to the electrodes 103.

In order to mount solder balls 115 on the substrate 100, a flux mask 108 is arranged on the substrate 100 (the solder resist 104). Openings are formed in the flux mask 108 in positions that correspond to the opening portions 106. Then, a flux 109 is filled in the opening portions 106 by the printing, or the like while using the flux mask 108. FIG. 9B shows a state that the flux 109 is filled in the opening portions 106.

After the filling of the flux 109 in the opening portions 106 is completed, the flux mask 108 is removed. Then, as shown in FIG. 9C, a solder ball mounting mask 110 is arranged on the substrate 100 (the solder resist 104). A plurality of ball feeding openings 112 used to mount (feed) the solder balls 115 on the flux 109 are formed in the solder ball mounting mask 110.

When the solder ball mounting mask 110 is arranged over the substrate 100, the solder balls 115 are fed onto the solder ball mounting mask 110. Then, the solder balls 115 are moved by using the squeegee, or the like and are fed into the ball feeding openings 112. FIG. 10A shows a state that the solder balls 115 are fed into the openings 112. In this state, respective solder balls 115 are mounted (temporarily fitted) on the flux 109 with a viscosity.

After the solder balls 115 are mounted on the flux 109, the solder ball mounting mask 110 is removed from the substrate 100, as shown in FIG. 10B. Then, the heating process such as the reflowing process, or the like is executed, and the solder balls 115 are joined to the electrodes 103. Accordingly, the solder balls 115 are mounted on the substrate 100, as shown in FIG. 10C.

In this case, because the solder ball mounting mask 110 exerts a great influence on a mounting efficiency of the solder balls 115, various configurations of the solder ball mounting mask have been proposed. For example, in the structure disclosed in Patent Literature 2, the solder ball mounting mask that aims at enhancing a mounting efficiency of the solder balls by providing a plurality of solder ball mounting masks and increasing a diameter of the ball feeding openings toward the upper layer has been proposed.

[Patent Literature 1] Japanese Patent Unexamined Publication No. 2006-005276

[Patent Literature 2] Japanese Patent Unexamined Publication No. 2003-347343

However, like the solder ball mounting method in the related art, in the method of feeding the solder balls 115 into the solder ball feeding ports 112 of the solder ball mounting mask 110 simply by using the squeegee, or the like, the solder ball feeding ports 112 into which no solder ball is fed are generated (this event is called a "missing ball").

This missing ball is discussed as the problem of probability, and occurred in the solder ball mounting process to some extent in the related art. Also, as disclosed in Patent Literature 2, the configuration in which the ball feeding openings each shaped to catch easily the solder ball are formed in the solder ball mounting mask are is employed, but an effect of such configuration does not function well. When the missing ball occurred in this manner, the process of specifying the location where the missing ball occurred by executing the inspecting step and then mounting the solder ball 115 individually on such location by using the jig, or the like is applied (this process is called the repairing process).

However, as described above, the higher density of the electronic components proceeds and the number of connection terminals tends to increase. Accordingly, it is demanded that the solder balls 115 should be mounted at a high density on the substrate 100. In order to respond to this demand, the miniaturization of the solder ball 115 is advancing, and the solder ball of 100 μm diameter is put now to practical use.

In this manner, when a reduction in the diameter of the solder ball 115 is accelerated, a large number of missing balls are generated in the solder ball mounting method in the related art and thus the repairing process must be applied frequently. As a result, there existed such a problem that an efficiency of the solder ball mounting process is considerably lowered.

SUMMARY

Exemplary embodiments of the present invention provide a solder ball mounting method and a solder ball mounting apparatus capable of mounting fine solder balls on a substrate effectively without fail.

A solder ball mounting method of one or more embodiments of the present invention, includes a step of providing a flux on electrodes formed on a substrate; a step of arranging a plurality of solder ball mounting masks, in which ball feeding openings are formed in positions opposing to the electrodes and opening areas of the ball feeding openings are set to increase toward an upper layer, on the substrate; a step of mounting solder balls on the electrodes respectively by feeding the solder balls into the ball feeding openings while moving one or plural masks out of the arranged plurality of solder ball mounting masks in a surface direction of the substrate; a step of removing the solder ball mounting masks from the substrate; and a step of joining the solder balls to the electrodes.

Also, a solder ball mounting apparatus of one or more embodiments of the present invention, includes a plurality of solder ball mounting masks to be arranged on a substrate and in which ball feeding openings are formed in positions opposing to electrodes formed on the substrate such that opening areas of the ball feeding openings are set to increase toward an upper layer; and a moving section for moving one or plural masks out of the arranged plurality of solder ball mounting masks in a surface direction of the substrate, upon feeding solder balls in the ball feeding openings.

In the above invention, the moving section may have a clamper for holding the solder ball mounting masks, an arm for supporting the clamper, and a driving device for driving the arm to move the solder ball mounting masks held by the clamper in the surface direction of the substrate.

According to the present invention, the solder balls are fed in the ball feeding openings while moving a plurality of solder ball mounting masks, in which the opening areas of the ball feeding openings are set to increase toward the upper layer, in the surface direction of the substrate. Therefore, even though the solder balls are miniaturized, such solder balls can be fed in the ball feeding openings without fail. As a result, the occurrence of the so-called missing ball can be reduced, the application number of times of the repairing process can be reduced, and the solder balls can be mounted on the electrodes effectively without fail.

Other features and advantages may be apparent from the following detailed description, the accompanying drawings and the claims.

DETAILED DESCRIPTION

Next, the best mode for carrying out the present invention will be explained with reference to the drawings hereinafter.

Figure 1:
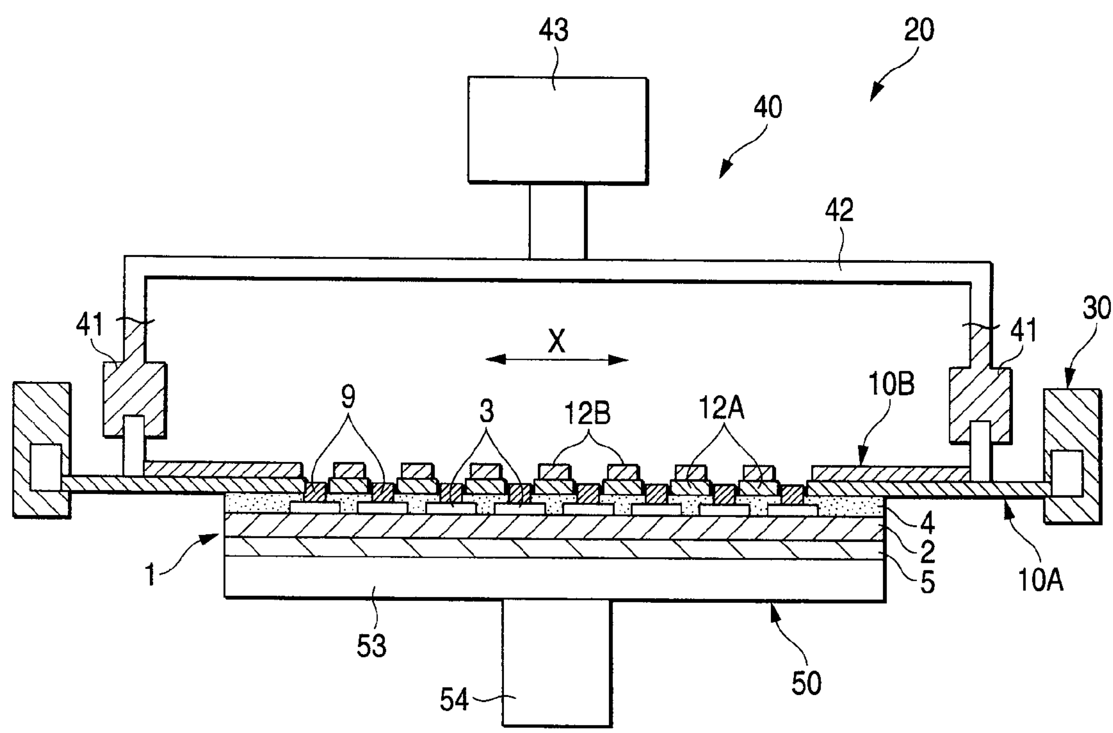
FIG. 1 is a configurative view explaining a solder ball mounting apparatus as an embodiment of the present invention.

FIG. 1 is a configurative view explaining a solder ball mounting apparatus 20 as an embodiment of the present invention. The solder ball mounting apparatus 20 is constructed roughly by a plurality (in the present embodiment, two sheets) of solder ball mounting masks 10A, 10B, a first moving device 30, a second moving device 40, and a stage 50.

Both solder ball mounting masks 10A, 10B are a mask made of metal respectively, and a plurality of ball feeding openings 12A, 12B used to mount solder balls 15 on a substrate 1 are formed therein respectively. The solder ball mounting mask 10A is provided just on the substrate 1, and the solder ball mounting mask 10B is arranged on the solder ball mounting mask 10A.

Also, a diameter of the ball feeding opening 12B formed in the solder ball mounting mask 10B is set larger than a diameter of the solder ball feeding opening 12A formed in the solder ball mounting mask 10A. That is, the diameter of the ball feeding opening 12B is set larger than a diameter of the opening area in the ball feeding opening 12A. Also, the solder ball mounting mask 10B is constructed to move on the solder ball mounting mask 10A in the surface direction of the substrate 1, as described later.

The first moving device 30 clamps the outer peripheral portion of the solder ball mounting mask 10A. The first moving device 30 fits the solder ball mounting mask 10A to the substrate 1 in mounting the solder balls 15 and removes the solder ball mounting mask 10A from the substrate 1 when the mounting process is completed. The first moving device 30 is arranged in the outer peripheral position of the solder ball mounting mask 10A.

The second moving device 40 includes a clamper 41, an arm 42, and a driving unit 43. The clamper 41 holds the solder ball mounting mask 10B by clamping the outer peripheral portion. This clamper 41 is constructed to clamp a plurality of outer peripheral locations (e.g., four locations at 90° interval) of the solder ball mounting mask 10B.

The arm 42 holds the clamper 41. This arm 42 is provided not to interfere with the first moving device 30. Also, an end portion of the arm 42 on the opposite side to the end portion to which the clamper 41 is fitted is connected to the driving unit 43.

The driving unit 43 moves the solder ball mounting mask 10B via the arm 42 and the clamper 41. Concretely, the driving unit 43 is constructed to move the solder ball mounting mask 10B in the lateral direction in FIG. 1 (referred to as the "X direction" hereinafter) and the vertical direction to a sheet surface of FIG. 1 perpendicular to this lateral direction (referred to as the "Y direction" hereinafter).

Also, the driving unit 43 is constructed to perform a movement in the X direction and a movement in the Y direction in combination. Therefore, the solder ball mounting mask 10B can be moved two dimensionally on the solder ball mounting mask 10A. Further, the driving unit 43 removes the solder ball mounting mask 10B from the substrate 1 when the mounting process is completed.

The stage 50 fulfills a function of holding the substrate 1. This stage 50 is constructed to have a stage portion 53 and a strut portion 54. A plurality of suction holes (not shown) are formed in the stage portion 53, and the substrate 1 is held on the stage 50 when the substrate 1 is sucked via the suction holes.

As described later, in the ball mounting step of mounting the solder balls 15 on the substrate 1, the solder ball mounting mask 10A is fitted on the substrate 1 by using the first moving device 30 in a state that the substrate 1 is held on the stage 50. Then, the solder ball mounting mask 10B is fitted by using the second moving device 40 and arranged on the solder ball mounting mask 10A.

In this manner, the solder ball mounting masks 10A, 10B are fitted, the solder balls 15 are introduced on the solder ball mounting mask 10B and simultaneously the driving device 43 starts to move the solder ball mounting mask 10B in the surface direction of the substrate. In this state, the process of feeding the solder balls 15 by using the squeegee, or the like is executed. As described in detail later, because the solder ball mounting mask 10B moves, an efficiency in feeding the solder balls 15 in the ball feeding openings 12A, 12B can be enhanced. Here, the solder ball mounting mask 10A maintains its stationary state on the substrate 1 while the solder ball mounting mask 10B is moving.

Next, a solder ball mounting method as the embodiment of the present invention will be explained with reference to FIG. 2 and FIG. 3 hereunder. The solder ball mounting method explained hereunder is carried out by using the above solder ball mounting apparatus 20. In the configuration shown in FIG. 2 and FIG. 3, the same reference symbols are affixed to the same configuration as that explained above and shown FIG. 1, and their explanation will be omitted herein. Also, illustration of constituent elements other than the solder ball mounting masks 10A, 10B out of the constituent elements of the solder ball mounting apparatus 20 is omitted from FIG. 2 and FIG. 3.

Figure 2A:
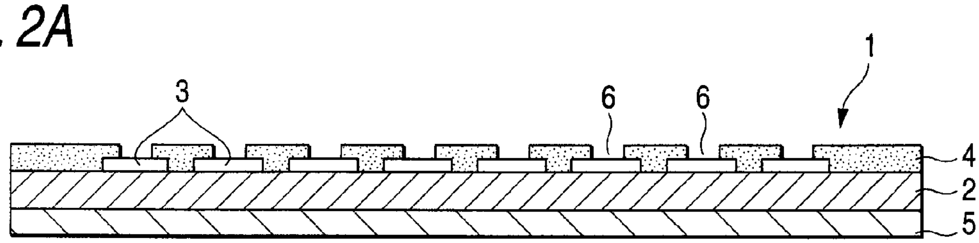
FIGS. 2A to 2D are views (#1) explaining a solder ball mounting method as the embodiment of the present invention.

FIG. 2A shows the substrate 1. This substrate 1 is constructed by a substrate main body 2, a solder resist 4 formed on an upper surface of the substrate main body 2, and an insulating film 5 formed on a lower surface of the substrate main body 2.

As the substrate main body 2, various types of substrates such as a resin substrate, a ceramic substrate, a Si wafer, a built-up substrate, and the like can be applied. A plurality of electrodes 3 (e.g., containing land portions formed in wiring patterns) are formed on an upper surface of the substrate main body 2.

In the present embodiment, an example in which the wafer is used as the substrate main body 2 will be explained. Also, a large number of element areas are formed on the wafer. However, in respective figures explained hereunder, only one element areas of the wafer is shown as the substrate main body 2 in an enlarged manner.

The solder resist 4 is the insulating material provided to suppress a solder short in the soldering process. The solder resist 4 is formed on the overall upper surface of the substrate main body 2 by a printing method, a method of providing a sheet-like solder resist, or the like, for example, to have a predetermined thickness (e.g., 30 to 40 μm). As other insulating materials, an epoxy resin, a polyimide resin, a silicon resin, or the like can be utilized.

Then, opening portions 6 are formed in the solder resist 4 in positions that oppose to the electrodes 3. Therefore, the electrodes 3 are exposed in the positions where the opening portions 6 are formed.

Also, the insulating film 5 is provided to protect a lower surface of the substrate main body 2. In this case, there is no need that the insulating film 5 should always be provided. The method of the invention of this application can be realized even if the insulating film 5 is not provided.

In order to provide a flux 9 on the substrate 1, the substrate 1 is sucked on the stage portion 53 while the substrate 1 is put on the stage 50. Thus, the substrate 1 is held on the stage 50. Then, a flux mask 8 is provided on the substrate 1. This flux mask 8 is a mask made of metal, and has openings corresponding to the opening portions 6.

Figure 2B:
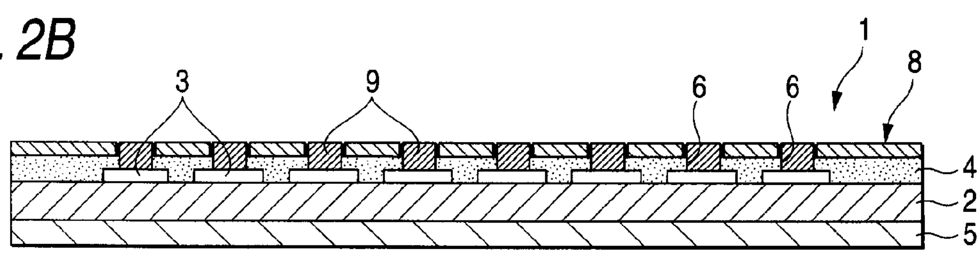
Figure 2C:
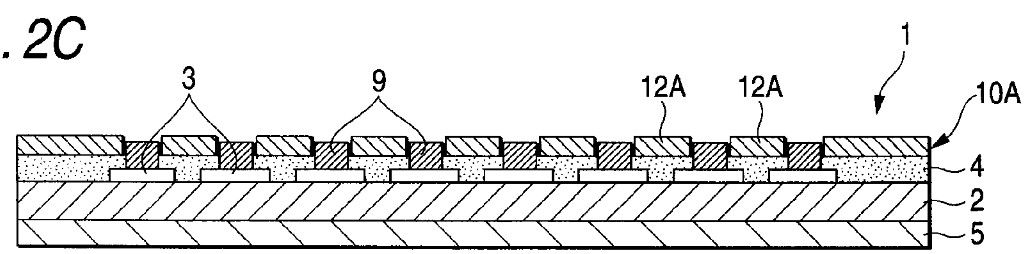

After the flux mask 8 is provided on the substrate 1, the flux 9 is provided in the opening portions 6 by using the flux mask 8 (flux providing step). FIG. 2B shows a state that the flux 9 is provided in the opening portions 6. A thickness of the coated flux 9 is set to constitute an almost planar surface with respect to a surface of the flux mask 8.

As the method of providing the flux 9 in the opening portions 6, for example, the printing method can be employed. When the providing process of the flux 9 is completed, the flux mask 8 is removed from the substrate 1.

Then, the first moving device 30 (see FIG. 1) is driven, and the solder ball mounting mask 10A is provided just over the substrate 1. In this providing process of the solder ball mounting mask 10A, first the ball feeding openings 12A formed in the solder ball mounting mask 10A and the electrodes 3 on the substrate 1 are positioned in registration with each other, and the solder ball mounting mask 10A is put on the substrate 1. At this time, the substrate 1 maintains a state that such substrate is held on the stage 50.

Figure 2D:
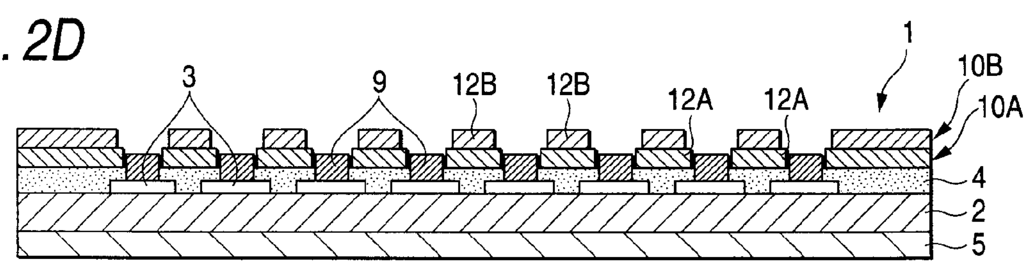

Then, the solder ball mounting mask 10B is put on the ball mounting mask 10A by operating the second moving device 40. Accordingly, the solder ball mounting mask 10A and the solder ball mounting mask 10B are arranged. Also, the ball feeding opening 12A and the ball feeding opening 12B are arranged concentrically in a condition just after the arrangement (a condition before the solder ball mounting mask 10B is moved, described later). FIG. 2D shows a state that the solder ball mounting mask 10A and the solder ball mounting mask 10B are arranged over the substrate 1 in their arranged condition.

As described above, an opening area of the ball feeding opening 12B in the solder ball mounting mask 10B positioned in the upper layer is set larger than an opening area of the ball feeding opening 12A in the solder ball mounting mask 10A positioned in the lower layer. Thus, the ball feeding openings 12A, 12B constitute a stepped hole like an almost funnel shape in the arranged state. Therefore, these openings form a easy-feed shape when the solder ball 15 is fed.

When the solder ball mounting masks 10A, 10B are arranged on the substrate 1, the driving device 43 is operated to start a movement of the solder ball mounting mask 10B via the arm 42 and the clamper 41. Accordingly, the solder ball mounting mask 10B moves on the solder ball mounting mask 10A in the surface direction of the substrate 1.

At this time, as described above, the solder ball mounting mask 10B is constructed such that the mask can take a motion in the X direction and a motion in the Y direction in combination. Therefore, the solder ball mounting mask 10B can take various motions such as a circular motion, an elliptic motion, a linear reciprocating motion, and the like.

In this manner, the solder ball 15 is fed into the ball feeding openings 12A, 12B respectively by supplying the solder balls 15 on the solder ball mounting mask 10B while the solder ball mounting mask 10B is moved on the solder ball mounting mask 10A (solder ball mounting step). At this time, the solder balls 15 may be fed by using the squeegee, or the like as the case may be.

In this manner, in the present embodiment, a plurality of solder ball mounting masks 10A, 10B are arranged such that the opening areas of the ball feeding openings 12A, 12B are set to increase toward the upper layer, and then the solder balls 15 are fed in the ball feeding openings 12A, 12B while moving the solder ball mounting mask 10B except the solder ball mounting mask 10A that contacts the substrate 1 as the lowest layer in the surface direction of the substrate 1. Therefore, even though the solder balls 15 are miniaturized, such solder balls 15 can be fed in the ball feeding openings 12A, 12B without fail. As a result, the occurrence of the so-called missing ball can be reduced, the application number of times of the repairing process can be reduced, and the solder balls 15 can be mounted on the electrodes 3 effectively without fail.

Next, the reason why an efficiency of feeding the solder balls 15 in the ball feeding openings 12A, 12B can be improved by moving the solder ball mounting mask 10B, as in the present embodiment, will be explained with reference to FIG. 4 to FIG. 6 hereunder.

Figure 4A:
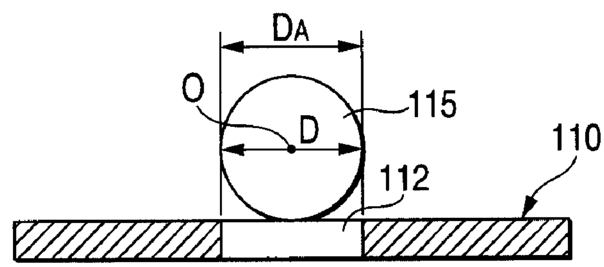
FIGS. 4A and 4B are views explaining a solder ball collecting area in the related art as a comparative example.
Figure 4B:
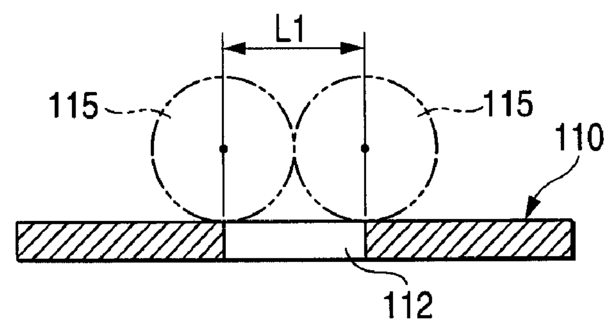

FIG. 4 shows the solder ball mounting mask 110 in the related art as a comparative example. In the related art, the feeding process of the solder ball 115 is executed by using a sheet of solder ball mounting mask 110, and the solder ball mounting mask 110 is not moved. Also, a diameter $D_A$ of the ball feeding opening 112 is set slightly larger than a diameter D of the solder ball ($D<D_A$).

In this configuration, in order to enable the solder ball 115 to be fed in the ball feeding opening 112 in the solder ball mounting mask 110, a center of gravity (indicated by O in FIG. 4) of the solder ball 115 must be positioned on the inner side of the ball feeding opening 112. Therefore, a range within which the solder ball 115 is fed in the ball feeding opening 112 corresponds to a range in which a center of gravity O of the solder ball 115 is positioned on the inner side of the ball feeding opening 112, i.e., an area range having a diameter indicated with an arrow L1 (this diameter is called a feeding diameter) in FIG. 4B therein (here $L1<D_A$).

Figure 5A:
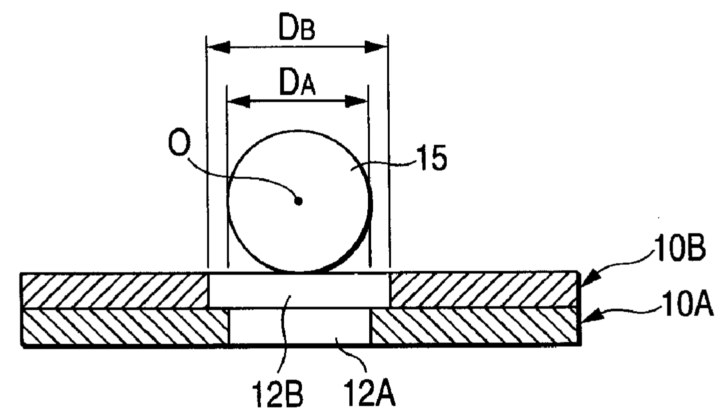
FIGS. 5A and 5B are views explaining a solder ball collecting area when a second solder ball mounting mask is fixed to a first solder ball mounting mask as a comparative example.

In contrast, FIG. 5 shows the configuration in which the solder ball mounting mask 10A and the ball mounting mask 10B similar to the present embodiment are arranged (the configuration similar to that in Patent Literature 2). But FIG. 5 shows an example where the solder ball mounting mask 10B is fixed and not moved, unlike the present embodiment.

As described above, a diameter $D_B$ of the ball feeding opening 12B formed in the solder ball mounting mask 10B as the upper layer is larger than a diameter $D_A$ of the ball feeding opening 12A formed in the solder ball mounting mask 10A as the lower layer ($D_A<D_B$).

Therefore, whether or not the solder ball 15 can be fed into the solder ball mounting masks 10A, 10B is decided depending on the area of the ball feeding opening 12B formed in the solder ball mounting mask 10B as the upper layer. That is, in order to allow the solder ball 15 to be fed in the ball feeding openings 12A, 12B, a center of gravity O of the solder ball 15 must be positioned on the inner side of the ball feeding opening 12B.

Figure 5B:
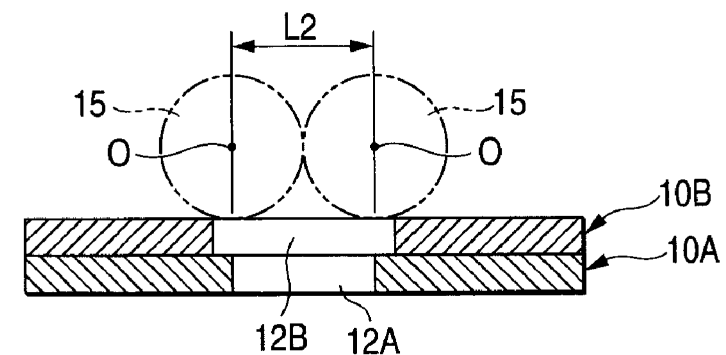

As a result, a range within which the solder ball 15 is fed in the ball feeding openings 12A, 12B corresponds to a range in which a center of gravity O of the solder ball 15 is positioned on the inner side of the ball feeding opening 12B, i.e., an area range having a feeding diameter indicated with an arrow L2 in FIG. 5B therein. As described above, since a diameter $D_B$ of the ball feeding opening 12B is larger than a diameter $D_A$ of the ball feeding opening 12A ($D_A<D_B$), a size relationship between the feeding diameters L1, L2 is given by L2>L1.

In other words, the configuration in which a plurality of solder ball mounting masks 10A, 10B are arranged such that the opening areas of the ball feeding openings 12A, 12B are set to increase toward the upper layer, as shown in FIG. 5, enables the solder balls 15 to mount on the ball feeding openings 12A, 12B more effectively than the configuration in which the feeding process is executed by using a sheet of the solder ball mounting mask 110, as shown in FIG. 4.

In contrast, FIG. 6 shows the configuration of the present embodiment. That is, in this configuration, the solder ball mounting mask 10A and the solder ball mounting mask 10B are arranged, and also the solder ball mounting mask 10B can be moved in the surface direction of the substrate 1. In the following explanation, for convenience of explanation, an example where the solder ball mounting mask 10A makes a reciprocating motion linearly in the directions indicated with arrows X1, X2 in FIG. 6 will be explained hereunder.

As apparent from the explanation using FIG. 5, in the configuration in which a plurality of solder ball mounting masks 10A, 10B are arranged, the ball feeding openings 12B formed in the solder ball mounting mask 10B positioned in the uppermost layer affects largely a feeding efficiency.

Figure 6A:
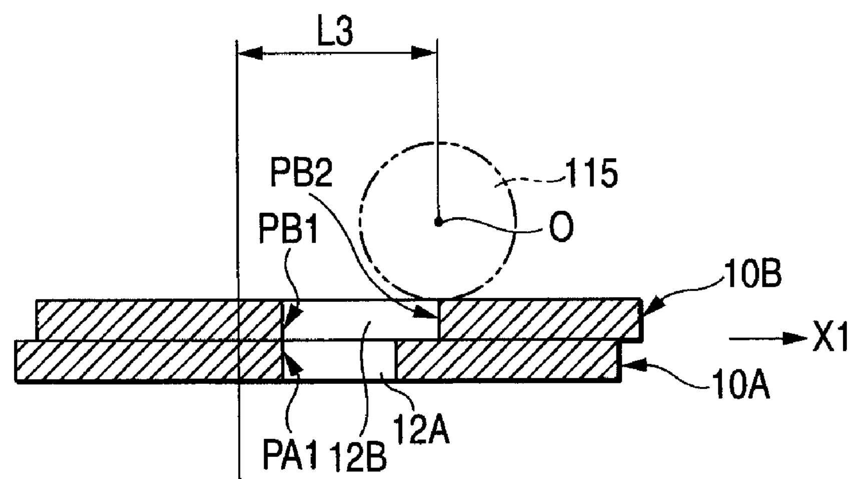
FIGS. 6A and 6B are views explaining a solder ball collecting area by the solder ball mounting method as the embodiment of the present invention.

Also, when the solder ball mounting mask 10B is moved, its moving distance cannot set to any distance and restricted to a constant distance. Concretely, as shown in FIG. 6A, when the solder ball mounting mask 10B is moved in the rightward direction in FIG. 6 (the arrow X1 direction), the solder ball mounting mask 10B can move up to a position where the left edge portion (indicated with an arrow PB1) of the ball feeding opening 12B is in accord with the left edge portion (indicated with an arrow PA1) of the ball feeding opening 12A. Conversely, as shown FIG. 6B, when the solder ball mounting mask 10B is moved in the leftward direction in FIG. 6 (the arrow X2 direction), the solder ball mounting mask 10B can move up to a position where the right edge portion (indicated with an arrow PB2) of the ball feeding opening 12B is in accord with the right edge portion (indicated with an arrow PA2) of the ball feeding opening 12A.

Figure 6B:
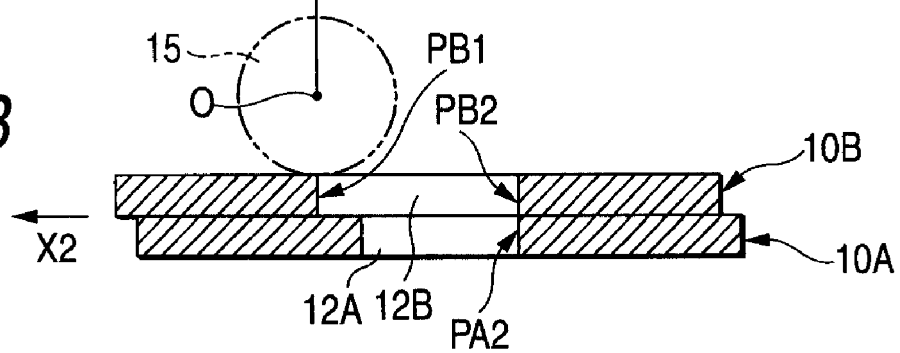
Figure 7A:
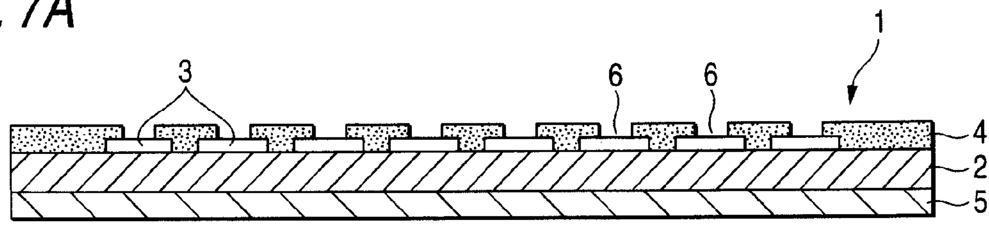
FIGS. 7A to 7E are views (#1) explaining a solder ball mounting method as a variation of the embodiment shown in FIGS. 2A to 3D.
Figure 7B:
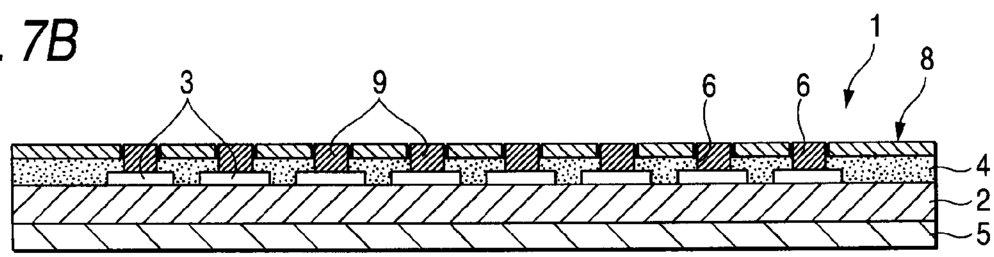
Figure 7C:
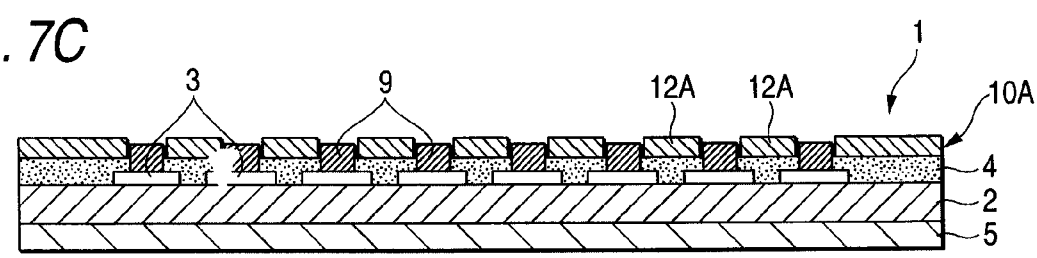
Figure 7D:
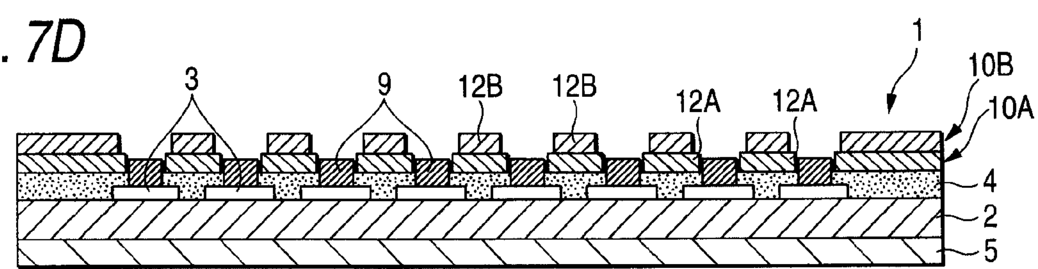
Figure 7E:
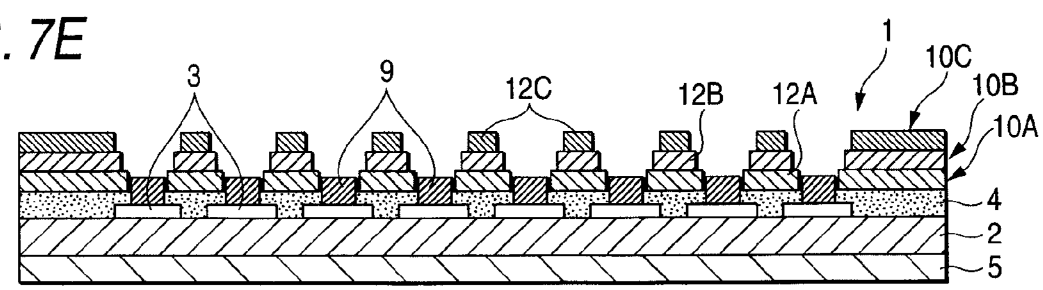
Figure 8A:
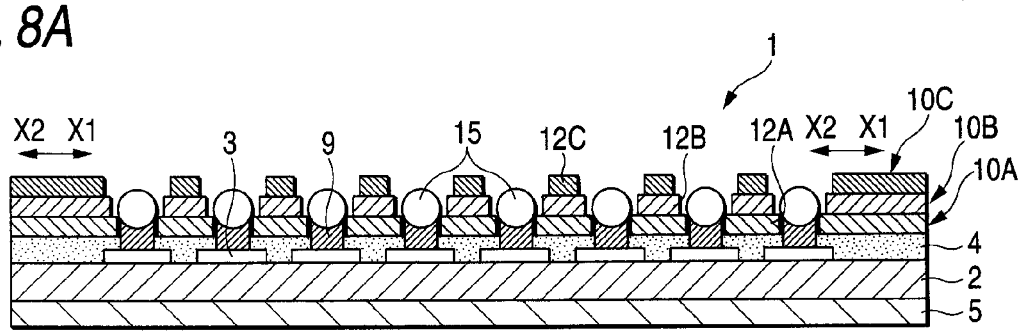
FIGS. 8A to 8D are views (#2) explaining the solder ball mounting method as the variation of the embodiment shown in FIGS. 2A to 3D.
Figure 8B:
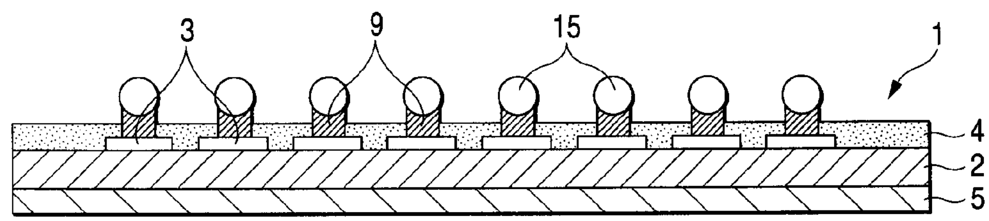
Figure 8C:
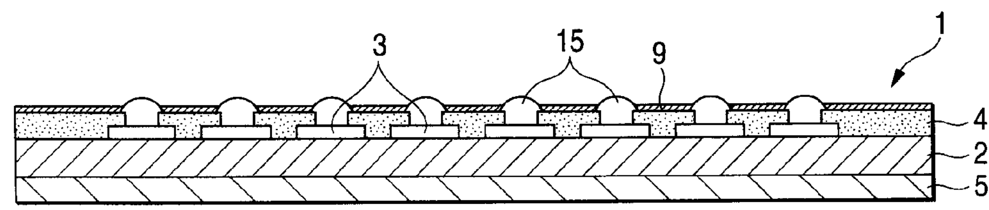
Figure 8D:
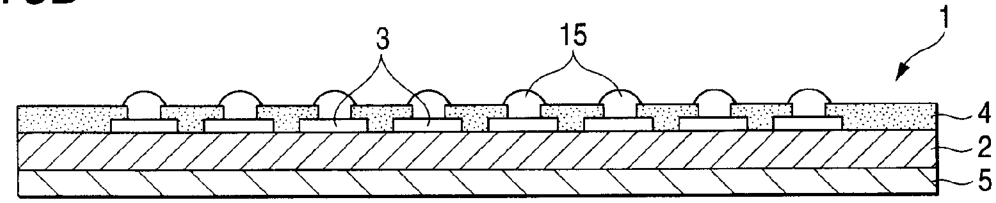
Figure 9A:
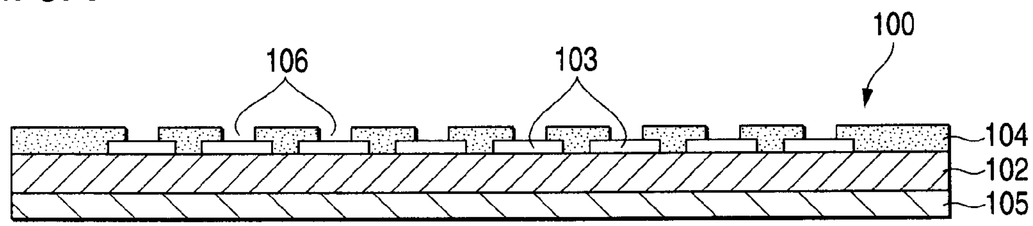
FIGS. 9A to 9C are views (#1) explaining a solder ball mounting method as an example in the related art.
Figure 9B:
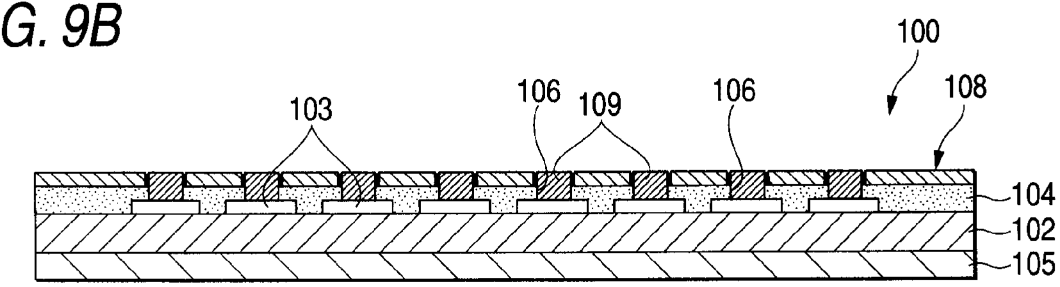
Figure 9C:
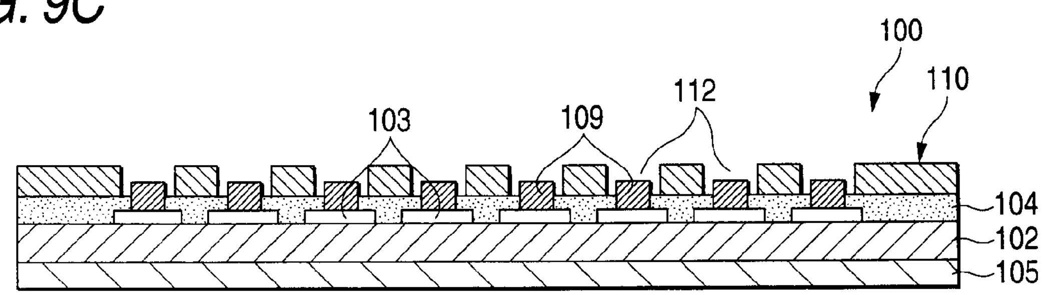
Figure 10A:
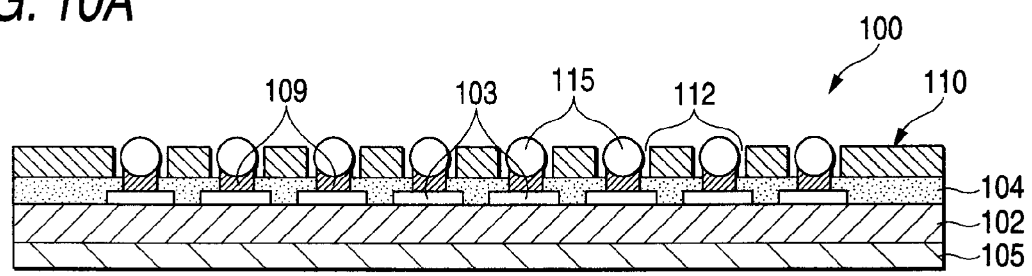
FIGS. 10A to 10C are views (#2) explaining the solder ball mounting method as the example in the related art.
Figure 10B:
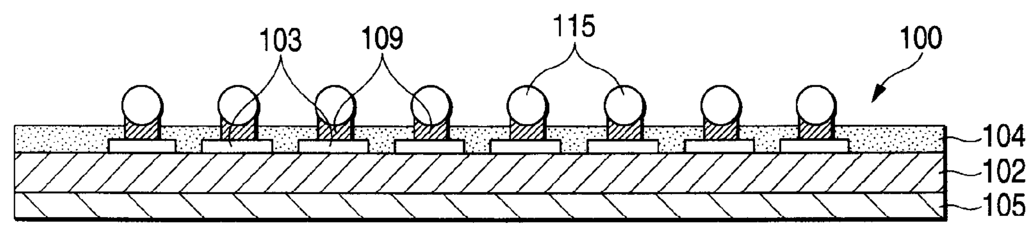
Figure 10C:
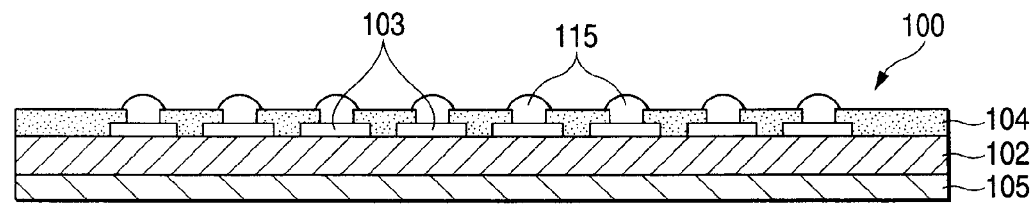

This is because, when either the solder ball mounting mask 10B is moved in the X1 direction beyond the position shown in FIG. 6A or the solder ball mounting mask 10B is moved in the X2 direction beyond the position shown in FIG. 6B in the situation that the solder ball 15 has already been fed in the ball feeding openings 12A, 12B, it is feared that such fed solder ball 15 is damaged by the movement of the solder ball mounting mask 10B.

Accordingly, first the condition that makes it possible to feed the solder ball 15 in the ball feeding openings 12A, 12B in the state that the solder ball mounting mask 10B is moved up to the limit in the X1 direction shown in FIG. 6A (the edge portion PB1 of the solder ball mounting mask 10B agrees with the edge portion PA1 of the ball mounting mask 10A) will be discussed hereunder. In order to feed the solder ball 15 in the ball feeding openings 12A, 12B in the state that the solder ball mounting mask 10B is moved up to the limit in the X1 direction, a center of gravity O of the solder ball 15 must be positioned on the inner side of the edge portion PB2 of the ball feeding opening 12B.

Next, the condition that makes it possible to feed the solder ball 15 in the ball feeding openings 12A, 12B in the state that the solder ball mounting mask 10B is moved up to the limit in the X2 direction shown in FIG. 6B (the edge portion PB2 of the solder ball mounting mask 10B agrees with the edge portion PA2 of the solder ball mounting mask 10A) will be discussed hereunder. In order to feed the solder ball 15 in the ball feeding openings 12A, 12B in the state that the solder ball mounting mask 10B is moved up to the limit in the X2 direction, a center of gravity O of the solder ball 15 must be positioned on the inner side of the edge portion PB1 of the ball feeding opening 12B.

Therefore, a range within which the solder ball 15 can be fed in the ball feeding openings 12A, 12B corresponds to an area range having a feeding diameter indicated with an arrow L3 in FIGS. 6A, B. As described above, a moving distance ΔL over which the solder ball mounting mask 10B is moved on the solder ball mounting mask 10A is given substantially by a difference between the feeding diameter $D_B$ of the ball feeding opening 12B and the feeding diameter $D_A$ of the ball feeding opening 12A ($\Delta L = D_B - D_A$). As a result, the feeding diameter L3 in the configuration of the present embodiment becomes larger than the feeding diameter L2 obtained when the solder ball mounting masks 10A, 10B shown in FIG. 5 are fixed, by almost ΔL (L3>L2).

Therefore, it is proved by the above explanation that the configuration of the present embodiment in which the solder ball mounting mask 10B is moved, as shown in FIG. 6, can mount more effectively the solder ball 15 on the ball feeding openings 12A, 12B in contrast to the configuration in which the feeding process is performed by using a sheet of solder ball mounting mask 110, as shown in FIG. 4, and the configuration in which the solder ball mounting masks 10A, 10B are fixed, as shown in FIG. 5.

Figure 3A:
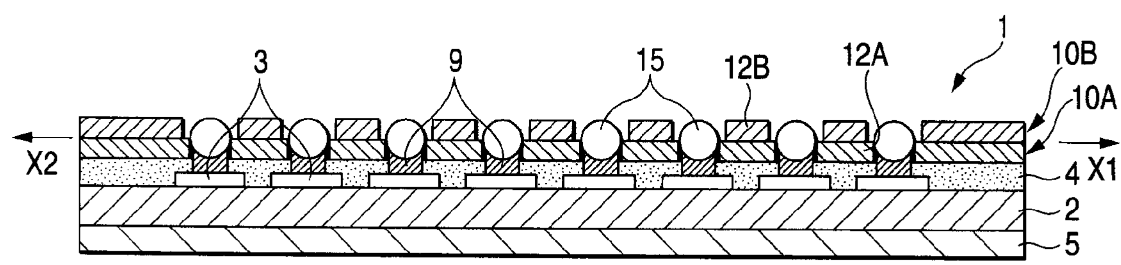
FIGS. 3A to 3D are views (#2) explaining the solder ball mounting method as the embodiment of the present invention.

Here, returning to FIG. 3 again, explanation of the solder ball mounting method will be continued hereunder. As described above, because the solder balls 15 are fed into the ball feeding openings 12A, 12B while moving the solder ball mounting mask 10B reciprocally in the surface direction of the substrate 1, the solder balls 15 can be fed into the ball feeding openings 12A, 12B without fail. FIG. 3A shows the state that the solder balls 15 are fed into the ball feeding openings 12A, 12B. In this state, respective solder balls 15 are mounted (temporarily fitted) on the flux 9 with a viscosity.

Figure 3B:
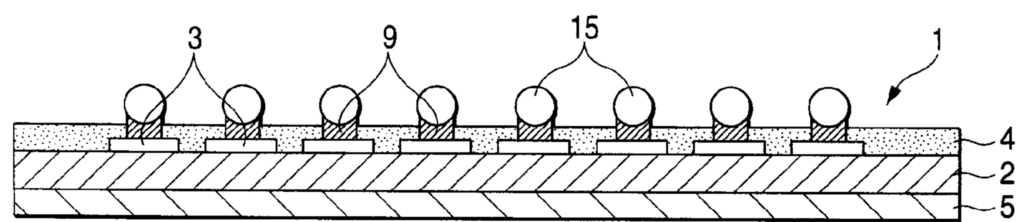

When the mounting process of the solder balls 15 is completed, the driving device 43 is stopped. But the condition that the substrate 1 is held on the stage 50 is maintained. Then, the second moving device 40 and the first moving device 30 are driven sequentially, and the solder ball mounting mask 10B and the solder ball mounting mask 10A are removed from the substrate 1. FIG. 3B shows the substrate 1 from which the solder ball mounting masks 10A, 10B are removed.

Figure 3C:
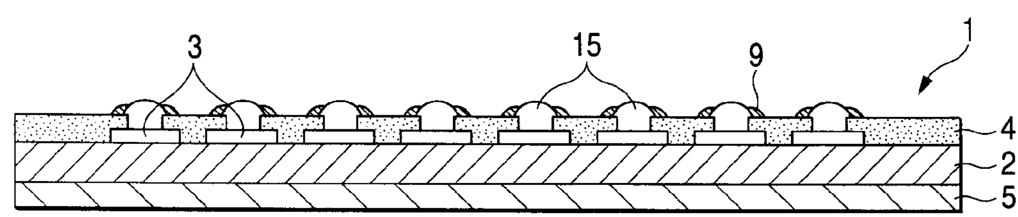

Then, the suction of the substrate 1 by the stage 50 is released. The substrate 1 is unloaded from the solder ball mounting apparatus 20 and then loaded on the reflow furnace. Then, the process of joining the solder balls 15 to the electrodes 3 is executed. FIG. 3C shows the state that the solder balls 15 are joined to the electrodes 3.

When the solder balls 15 are joined to the electrodes 3, the cleaning process of the flux 9 is carried out subsequently. Thus, as shown in FIG. 3D, the substrate 1 in which the solder balls 15 are joined to the electrodes 3 is completed.

Next, a variation of the above embodiment will be explained hereunder. FIG. 7 and FIG. 8 show a variation of the solder ball mounting method explained with reference to FIG. 2 and FIG. 3.

Figure 3D:
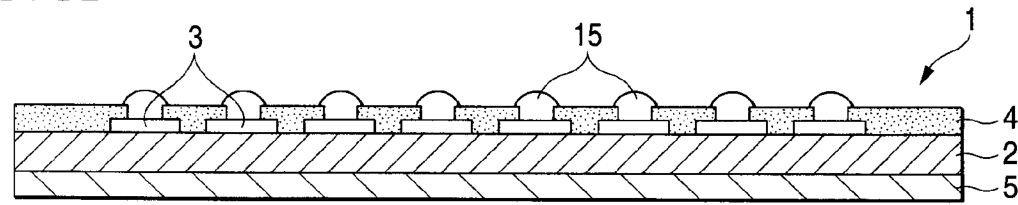

In this case, since FIG. 7A to FIG. 7D are the same processes as those in FIG. 2A to FIG. 2D and FIG. 8B to FIG. 8D are the same processes as those in FIG. 3B to FIG. 3D, their explanation will be omitted herein. Only the process shown in FIG. 7E and FIG. 8A in which the different process is executed will be explained hereunder.

In the above embodiment, the configuration in which two sheets of solder ball mounting masks 10A, 10B are arranged is employed. In contrast, the present variation is characterized in that three sheets of solder ball mounting masks 10A, 10B, 10C are arranged.

Also, in the present variation, the ball feeding openings 12A to 12C formed in the arranged solder ball mounting masks 10A to 10C are set in such a way that the opening areas (feeding diameters) in the ball feeding openings 12A to 12C are increased toward the upper layer. Also, like the above embodiment, the solder ball mounting mask 10A is put on the substrate 1 and is never moved.

In contrast, the solder ball mounting masks 10B, 10C are moved in the surface direction of the substrate 1 in the solder ball mounting step. Therefore, the solder balls 15 can be moved into the ball feeding openings 12A to 12C while moving two sheets of solder ball mounting masks 10B, 10C at a time of solder ball mounting step. Also, a feeding diameter of the ball feeding opening 12C is set larger than the feeding diameter of the ball feeding opening 12B. As a result, a feeding efficiency of the solder balls 15 into the ball feeding openings 12A to 12C can be enhanced further rather than the above embodiment. At this time, the solder ball mounting masks 10B, 10C are sometimes moved mutually in the opposite direction, and there is no need that the solder ball mounting masks 10B, 10C should always be moved in the same direction.

In the above embodiment, an example where the wafer is employed as the substrate 1 is explained. But the application of the present invention is not limited to the wafer, and the present invention can be applied to the case where the build-up substrate is employed as the substrate main body 2. Also, the positions where the solder balls 15 are provided is not limited to one surface of the substrate main body 2. The invention of this application can be applied to the case where the solder balls 15 are provided on both surfaces of the substrate main body 2.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A solder ball mounting method comprising the steps of:

providing a flux on electrodes formed on a substrate;

arranging a first solder ball mounting mask on the substrate, the first solder ball mounting mask having ball feeding openings in positions opposing the electrodes;

arranging a second solder ball mounting mask on the first solder ball mounting mask, the second solder ball mounting mask having ball feeding openings in positions opposing the electrodes, the ball feeding openings of the second solder ball mounting mask having a diameter larger than a diameter of the ball feeding openings of the first solder ball mounting mask;

feeding solder balls into the ball feeding openings of the second solder ball mounting mask and the ball feeding openings of the first solder ball mounting mask respectively by moving the second solder ball mounting mask with respect to the first solder ball mounting mask in a surface direction of the substrate;

restricting movement of the second solder ball mounting mask such that when the second solder ball mounting mask is moved in one direction the second solder ball mounting mask stops when a left edge of ball feeding openings of the second solder ball mounting mask is in alignment with a left edge of the ball feeding openings of the first solder ball mounting mask and when the second solder ball mounting mask is moved in an opposite direction the second solder ball mounting mask stops when a right edge of ball feeding openings of the second solder ball mounting mask is in alignment with a right edge of the ball feeding openings of the first solder ball mounting mask;

removing the first and second solder ball mounting masks from the substrate; and joining the solder balls to the electrodes.

2. The solder ball mounting method of claim 1, wherein the second solder ball mounting mask moves with respect to the first solder ball mounting mask in a circular motion.

3. The solder ball mounting method of claim 1, wherein the second solder ball mounting mask moves with respect to the first solder ball mounting mask in an elliptic motion.

4. The solder ball mounting method of claim 1, wherein the second solder ball mounting mask moves with respect to the first solder ball mounting mask in a linear reciprocating motion.

5. The solder ball mounting method of claim 1, wherein prior to the step of feeding solder balls into the ball feeding openings of the second solder ball mounting mask and the ball feeding openings of the first solder ball mounting mask respectively by moving the second solder ball mounting mask with respect to the first solder ball mounting mask in a surface direction of the substrate, the method further comprising the steps of:

arranging a third solder ball mounting mask on the second solder ball mounting mask; and feeding solder balls into the ball feeding openings of the third solder ball mounting mask, the ball feeding openings of the second solder ball mounting mask, and the ball feeding openings of the first solder ball mounting mask respectively by moving the second solder ball mounting mask and the third solder ball mounting mask independently of each other and with respect to the first solder ball mounting mask in a surface direction of the substrate.

6. The solder ball mounting method of claim 5, wherein the second solder ball mounting mask and the third solder ball mounting mask move with respect to the first solder ball mounting mask in a circular motion.

7. The solder ball mounting method of claim 5, wherein the second solder ball mounting mask and the third solder ball mounting mask move with respect to the first solder ball mounting mask in an elliptic motion.

8. The solder ball mounting method of claim 5, wherein the second solder ball mounting mask and the third solder ball mounting mask move with respect to the first solder ball mounting mask in linear reciprocating motion.

9. The solder ball mounting method of claim 5, wherein the third solder ball mounting mask includes ball feeding openings in positions opposing the electrodes, the ball feeding openings of the third solder ball mounting mask having a diameter larger than the diameter of the ball feeding openings of the second solder ball mounting mask.

* * * * *